US006616818B2

(12) United States Patent
Gibson

(10) Patent No.: US 6,616,818 B2
(45) Date of Patent: Sep. 9, 2003

(54) APPARATUS AND METHOD FOR COATING SUBSTRATES

(75) Inventor: Desmond Gibson, Peterborough (GB)

(73) Assignee: RTC Systems Ltd., Biggleswade (GB)

( * ) Notice: Subject to any disclaimer, the term of this patent is extended or adjusted under 35 U.S.C. 154(b) by 0 days.

(21) Appl. No.: 09/924,634

(22) Filed: Aug. 8, 2001

(65) Prior Publication Data
US 2002/0153247 A1 Oct. 24, 2002

(30) Foreign Application Priority Data
Aug. 11, 2000 (GB) .............................. 0019848

(51) Int. Cl.[7] .................. C23C 14/34; C23C 16/00; B05C 11/00; B05C 11/11
(52) U.S. Cl. .................. 204/298.03; 204/298.04; 204/298.11; 204/298.23; 204/298.27; 204/298.28; 118/712; 118/715; 118/720; 118/723 R; 118/504
(58) Field of Search .................. 204/298.03, 298.04, 204/298.11, 298.23, 298.27, 298.28, 192.11, 192.12; 118/712, 715, 720, 723 R, 504; 427/248.1

(56) References Cited

U.S. PATENT DOCUMENTS

| | | | |
|---|---|---|---|
| 3,667,424 A | 6/1972 | Corneluis et al. | 118/49.5 |
| 4,640,334 A | 2/1987 | Koerner | 164/287 |
| 4,776,299 A | 10/1988 | Hill | 118/727 |
| 5,178,739 A * | 1/1993 | Barnes et al. | 204/192.12 |
| 5,296,122 A | 3/1994 | Katsube et al. | 204/298.04 |
| 5,490,912 A | 2/1996 | Warner et al. | 204/298.02 |
| 5,618,388 A | 4/1997 | Seeser et al. | 204/192.12 |
| 5,665,214 A * | 9/1997 | Iturralde | 204/298.03 |
| 5,879,519 A | 3/1999 | Seeser et al. | 204/192.12 |
| 6,010,600 A | 1/2000 | Vernon et al. | 204/192.11 |
| 6,090,458 A * | 7/2000 | Murakami | 427/586 |
| 6,132,575 A | 10/2000 | Pandumsoporn | |
| | | et al. | 204/298.06 |
| 6,238,531 B1 * | 5/2001 | Pinarbasi | 204/298.04 |
| 6,350,317 B1 * | 2/2002 | Hao et al. | 118/71 |

FOREIGN PATENT DOCUMENTS

| | | | |
|---|---|---|---|
| DE | 282364 A7 | 9/1990 | C23C/14/00 |
| EP | 0328257 B1 | 4/1997 | C23C/14/56 |
| GB | 1177081 | 1/1970 | C23C/13/12 |

OTHER PUBLICATIONS

Nobuo, WPI/Derwent Abstract of JP3061361, Thin Film Forming Device, Mar. 18, 1991.
Takeshi et al., WPI Derwent Abstract of JP7216539, Film Forming Device and Production of Thin Film Using the Same, Aug. 15, 1995.
Kimisumi et al., WPI/Derwent Abstract of JP2141573, Method and Device for Ion Beam Sputtering, May 30, 1990.
Database Inspec 'Online!, Institute of Electrical Engineers, Stevenage, GB; Fujimoto T et al: "An ultrahigh vacuum sputtering system with offset incidence magnetron sources onto a rotating substrate": Database accession No. 64155002: XP002217212:.
Database Inspec 'Online!, Institute of Electrical Engineers, Stevenage, GB; Wright M P: "Post magnetron sputter and reactive sputter coating of contoured glass, acrylic and polycarbonate substrates": Database accession No. 2857142: XP002217213.

* cited by examiner

Primary Examiner—Steven H. VerSteeg
(74) Attorney, Agent, or Firm—Roberts, Mlotkowski & Hobbes PC; Peter W. Roberts; Laurence P. Hobbes

(57) ABSTRACT

Apparatus (10) for treating a substrate, comprising: a vacuum chamber (12); a substrate carrier (14) adapted to carry a substrate (16) to be treated; a source material holder (22) for holding a source material (34) with which the substrate (16) is to be treated; and vaporising or sputtering means (20) for vaporising/sputtering the source material (34); wherein the source material holder (22) includes a positioning means (24) for relatively moving the source material (34) towards the substrate carrier (14).

29 Claims, 5 Drawing Sheets

APPARATUS AND METHOD FOR COATING SUBSTRATES

This invention relates to an apparatus and a method for coating substrates. The apparatus and method may also be applicable to cleaning substrates. More particularly, the invention relates to an apparatus and a method for the vacuum deposition of a vaporised coating material on a substrate.

The thickness uniformity of evaporated films to high precision levels over extended areas is becoming a key requirement in a range of applications.

This is particularly the case for multilayer dielectric optical coatings for precision applications such as dense wavelength division multiplexer (DWDM) filters, which demand ±0.02% thickness control. Production demands for such filters are driving the need to extend such thickness control over increased areas thereby maximising production throughput. The reasons for the limitations in achieving thickness uniformity are complex, but lie mainly in stability and control of the spatial distribution of the evaporation plume from the deposition source, particularly over extended deposition times. Mechanical masking techniques, static (H. Anders, Dr. H. Anders Company, D-8470, Nabburg, Germany; H. Donz, Thesis, Inst. Of Experimental Physics, University of Innsbruck, Austria; Th. Kraus, Vakuum Techn., 31 (1982), 130) and dynamic (L. G. Schultz, J. Opt. Soc. Am., 38 (1948) 432) are well demonstrated to achieve film thickness uniformity, but these rely upon stable spatial distribution in the evaporant plume.

The increase in substrate to evaporant surface distance as material is consumed within the source material is an important source of variation in spatial distribution of the evaporant plume. Another detrimental consequence of this effect is a change in evaporating species characteristics at the source material—for example, when using electron beam vaporisation there may be a change in the electron beam spot diameter with increased distance beam travels due to source depletion.

It has been described in "G. Deppisch, Vakuum-Techn., 30 (1981) 67", that for a point evaporation source, this effect causes film thickness non-uniformity to increase as a consequence of reducing relative thickness at the edge compared with centre of the coated area.

For a 2% change in source material to substrate distance (typical for ultra-high precision applications such as DWDM), the effective change in uniformity is of the order of 0.05% over typical substrate areas (4 inch to 8 inch (10.2 to 20.4 cm) diameter). This level of non-uniformity significantly reduces the useable area of the substrate. The present invention makes it possible to reduce or even eliminate the effects of this problem.

We have now found a way of improving the uniformity of thickness of the deposited layers beyond what is possible using static or dynamic masking.

In accordance with one broad aspect of the invention, the distance between the source material and the substrate is adjustable. This makes it possible to move the source material to take account of the increased distance between the surface of the source material and the substrate which take place as the source material is depleted.

In accordance with another broad aspect of the invention, a beam used to vaporise the source material may have its frequency or diameter adjusted to take account of the variations in the surface of the source material which take place as the source material is depleted. This makes it possible to reduce or even eliminate the effects of the change in the profile of the source material surface as a consequence of the evaporation process. This is another source of variation in spatial distribution of the evaporant plume. Surface profile changes introduces a greater range of presented surface angles to the evaporating species (i.e. electron beam or ion flux for sputter deposition).

The present invention also provides a means of monitoring the spatial distribution of the evaporant plume and utilising such information to control substrate to evaporant surface distance, and, for electron beam deposition, to modify electron beam scan. Significant improvements in film thickness uniformity have been achieved.

According to one aspect of the invention there is provided an apparatus for treating a substrate, comprising: a vacuum chamber; a substrate carrier adapted to carry a substrate to be treated; a source material holder for holding a source material with which the substrate is to be treated; and vaporising/sputtering means for vaporising/sputtering the source material; wherein the source material holder includes a positioning means for relatively moving the source material towards the substrate carrier.

Thus, the apparatus according the invention makes it possible to adjust the distance between the substrate and the surface of the source material (i.e. the material to be vaporised for subsequent deposition on the substrate). The distance could be adjusted by movement of the source material holder, by movement of the substrate carrier, or both. It is preferred that it is only the source material holder that is moved. The adjustment of the distance can maintain a substantially constant distance between the surface of the source material and the substrate carrier, or, preferably, the surface of the source material and the surface of the substrate being treated. Where the treatment involves deposition of the source material, the thickness of the substrate increases while the thickness of the source material decreases—the present invention is capable of dealing with this phenomenon.

Typically the treatment comprises either coating or cleaning the substrate. From this point on the invention will be described in relation to the coating of substrates, but it will be appreciated that the features of the invention described hereinbelow are equally applicable to the cleaning of substrates.

Furthermore the apparatus is equally applicable to coating techniques involving vaporising or sputtering. Vaporising techniques involve the use of a means to heat and vaporise (i.e. evaporate) the source material. These techniques commonly use (1) an electron beam vaporiser, in which the source material is vaporised by means of a vaporising beam in the form of a stream of electrons; or (2) a thermal vaporiser, in which the source material is vaporised by the application of heat. Sputtering techniques involve the bombardment of the source (which is usually called a target) with a broad plasma (known as "sputtering") or with an ion beam (known an "ion beam sputtering"). In sputtering techniques the target is usually electrically biased to attract ions from the plasma or ion beam. From this point on the invention will be described in relation to the vaporisation techniques, but it will be appreciated that the features of the invention described hereinbelow are equally applicable to sputtering techniques.

It is especially preferred that the positioning means can move the source material linearly, so that the source material can be moved linearly towards the substrate. In most embodiments, the linear movement will take place in a substantially vertical direction. It is also preferred that the positioning means can move the source material away from the substrate carrier as well as towards it.

Preferably, the source material holder further comprises a receptacle adapted to contain the source material, this receptacle being known in the art as a hearth. The positioning means acts on the receptacle to move it in the desired direction.

It is possible for the positioning means to be arranged to move both the receptacle and the vaporising means relative to the substrate carrier, so that there is no relative movement between the source material holder and the vaporising means (other than a possible relative rotation of the receptacle as described below). However, in an especially advantageous embodiment, the positioning means is capable of moving the source material linearly relative to the vaporising means. This makes it possible for the surface of the source material to be adjusted relative to a vaporising beam generated by the vaporising means.

In the preferred embodiment, the positioning means comprises rotation means for rotating the receptacle and linear movement means for moving the receptacle linearly. Most preferably, the arrangement is such that the linear movement means moves both the rotation means and the receptacle linearly.

In the preferred construction the rotation means comprises a rotatable carrier, on which the receptacle is mounted, and a drive means, such as an electrical motor for driving rotation of the rotatable carrier.

The linear movement means preferably includes a rotary movement to linear movement conversion means whereby a rotary movement of one part is arranged to produce a linear movement in another part. More specifically, the linear movement means preferably comprises a rotatable member, fixed against translational movement relative to the chamber, and a drive means for driving rotation of the rotatable member. The linear movement means preferably also comprises a non-rotatable carrier which is linearly movable, and which engages the rotatable member such that rotation of the rotatable member causes said linear movement of the non-rotatable carrier. This can be achieved in a variety of ways. For example the rotatable member and the non-rotatable carrier could be arranged co-axially with cooperating internal and external screwthreads; or the rotatable member may be spaced to one side of the non-rotatable carrier and may be provided with a projection which engages a screwthread in the non-rotatable carrier.

Preferably, the rotatable carrier is mounted on the non-rotatable carrier by means of a bearing arrangement, whereby linear movements of the non-rotatable carrier are translated to the rotatable carrier (and hence to the receptacle) while the rotatable carrier remains free to rotate relative to the non-rotatable carrier.

Preferably a stepped drive means, such as a stepper motor, is used to control rotation of the rotatable member, whereby the non-rotatable carrier can be moved linearly in steps of known length, such as 1 to 50 micrometres, more usually 10 to 30 micrometers and most preferable about 20 micrometers.

Preferably, the apparatus according to the invention further comprises a control means for controlling the positioning means. The control means makes it possible to control the position of the positioning means.

It is preferred that the control means is also capable of controlling the vaporising means. In particular, the control means can be arranged to vary the frequency and/or the diameter of the vaporising beam generated by the vaporising means. The control means may instead, or in addition, be capable of controlling the movement of the vaporising beam in order to cause it to dither over the surface of the source material. The dithering may be randomly generated over a small area of a diameter of, for example, a fraction of a millimetre up to a few millimetres. In practice the vaporising beam is usually swept linearly along the surface of the source material while the source material is being rotated; in these circumstances, the dithering serves to add a random lateral element to the movement. (As indicated above this form of control is equally applicable to sputtering techniques).

It is desirable that the apparatus further includes a detection means adapted to detect certain conditions within the chamber.

We prefer that the detection means includes a vapour detection means adapted to detect the vaporised source material within the chamber. Preferably the vapour detection means comprises at least one detector capable of detecting the vapour. It is preferable to use more than one detector as this provides a better picture of the state of the vapour within the chamber. In practice, at least three vapour detectors are preferred, and, ideally, there should be a minimum of six detectors. The detectors are most preferably distributed quartz crystals. These crystals change the frequency of oscillation as the amount of vaporised material builds up, and hence provide a measure of the amount of vaporised material. The crystals can also detect sputtered material, when the invention is applied to sputtering. The spatial orientation of the vaporised material can be determined by position several of the detectors (preferably six) around the chamber. The output from the detection means is preferably connected to the control means, whereby the output from the detection means can be used to control the positioning means.

We prefer that the detection means additionally, or instead, comprises an optical monitoring detection means adapted to detect the level of deposition of the source material on the substrate. Preferably the substrate detection means includes at least one detector capable of detecting the change in light level due to optical interference from the film surfaces as the thickness of the deposit on the substrate changes. In practice, a monochromatic beam at the desired design wavelength $\lambda_0$ is obtained in the monitoring system by incorporating a monochromator, and a measure of the transmittance of the deposited coating is obtained in terms of the detector output. Specific transmittance is a function of the film thickness.

It is preferable to use more than one detector, spatially distributed, as this provides a measure of the level of deposition over the whole of the substrate. In practice, at least three substrate detectors are preferred at centre, middle and edge substrate positions. The substrate detection means may comprise a light source and a light detector each arranged on opposite sides of the substrate. The light source may be a laser, the light from which may be split into two, three or more beams by conventional means. Each beam is directed towards a different part of the substrate. A respective detector corresponding to each beam is arranged on the opposite side of the substrate, and the signal level of the detected light provides a measure of the thickness of deposited material.

There are three main techniques by which the output from the vapour detection means can be used to control the positioning means.

(1) An empirical technique. Using this technique, the profile of the vaporised material has been empirically correlated with settings of the positioning means and/or the vaporising beam, and the control means sets the positioning means and/or the vaporising beam in accordance with pre-memorised data about various profiles of the vaporised material.

(2) A real time technique. This involves controlling the positioning means and/or the vaporising beam in real time using an algorithm which determines the optimum settings in real time based on the data received from the vapour detection means.

(3) A batch technique. This involves resetting the positioning means and/or the vaporising beam settings between deposition of layers on the substrate (in practice, many layers are usually deposited on the substrate, and the apparatus is usually shut down between deposition of each layer).

These three techniques are equally applicable to the control of the substrate detection means.

It is well known in the art that the shape of the plume of the vaporised material generally assumes a $(\cos ine)^q$ shape between the source and the substrate, where q depends on a variety of factors including the nature of the source material. In order to adjust for this it is common to employ one or more static masks which restrict the deposition on certain parts of the substrate. The masks usually allow part, but not all, of the vaporised material to pass therethrough. In the present invention the use of such static masks may be used.

It is also known to use dynamic masks, which can be moved in relation to the substrate in order to adjust the deposition rate on parts of the substrate in real time. It is preferred that dynamic masks are used in the present invention. It is further preferred that the dynamic masks are connected to the control means so that the data from the detection means can be used to control movement of the masks.

The primary application for apparatus according to the present invention is in the precision optical coating of oxide and fluoride based deposition materials. These can be used to provide anti-reflection coatings for ophthalmic lenses, high tolerance multilayer dielectric optical coatings for telecommunications and high laser damage coatings. The composition of the source material itself depends upon the coating required. For an anti-reflection coating, the source material may typically be $TiO_2$ or $SiO_2$. The substrate may be provided with multiple layers (for example 100 to 250 layers), and adjacent layers may be formed of a different source material. The typical thickness of each layer is about 0.1 to 0.5 microns.

The apparatus according to the present invention may further include a plasma generator to generate a plasma to assist with the deposition of the source material. Alternatively, the apparatus may include an ion beam generator to generate ions to assist with the deposition of the source material. Such techniques are conventional in the art of vacuum deposition.

The substrate carrier may carry one or more substrates. Typically the substrate carrier would either carry one large substrate or a plurality of smaller substrates.

According to another aspect of the invention there is provided a method of treating a substrate with a source material initially disposed in a source material holder, said method comprising evaporating or sputtering the source material from a surface thereof under vacuum conditions to provide a vaporised or sputtered material for use in treating the substrate, and relatively moving the source material holder towards the substrate carrier as the source material is evaporated or sputtered.

According to another aspect of the invention there is provided a source material holder for holding a source material intended for treating a substrate carried on a substrate carrier, said source material holder comprising a receptacle adapted to contain the source material, means to rotate the receptacle, and means to move the receptacle linearly, whereby the source material can be rotated and moved linearly simultaneously.

The source material is especially intended for use in the treatment of substrates by vaporisation or sputtering of the source material. To this end, the source material holder preferably further comprising means to vaporise/sputter the source material.

According to another aspect of the invention there is provided an apparatus for coating or cleaning a substrate, comprising: a vacuum chamber; a substrate carrier adapted to carry a substrate to be treated; a source material holder for holding a source material which is to treat the substrate; and vaporising/sputtering means for vaporising/sputtering the source material; wherein the vaporising/sputtering means includes means to generate a vaporising/sputtering beam for vaporising/sputtering the source material at a surface thereof, and includes means to vary the frequency of the vaporising/sputtering beam.

According to another aspect of the invention there is provided an apparatus for coating or cleaning a substrate, comprising: a vacuum chamber; a substrate carrier adapted to carry a substrate to be treated; a source material holder for holding a source material which is to treat the substrate; and vaporising/sputtering means for vaporising/sputtering the source material; wherein the vaporising/sputtering means includes means to generate a vaporising/sputtering beam for vaporising/sputtering the source material at a surface thereof, and includes means to vary the thickness of the vaporising/sputtering beam.

According to another aspect of the invention there is provided an apparatus for coating or cleaning a substrate, comprising: a vacuum chamber; a substrate carrier adapted to carry a substrate to be treated; a source material holder for holding a source material which is to treat the substrate; and vaporising/sputtering means for vaporising/sputtering the source material; wherein the vaporising/sputtering means includes means to generate a vaporising/sputtering beam for vaporising/sputtering the source material at a surface thereof, and includes means to dither the vaporising/sputtering beam over the surface of the source material.

According to another aspect of the invention there is provided an apparatus for coating or cleaning a substrate, comprising: a vacuum chamber; a substrate carrier adapted to carry a substrate to be coated or cleaned; a source material holder for holding a source material which is to coat or clean the substrate; and vaporising/sputtering means for vaporising/sputtering the source material; wherein the vaporising means includes means to generate a vaporising beam for vaporising a source material to be deposited at the surface thereof, and means to vary the frequency, thickness and or dither of the vaporising beam. In the preferred embodiment, the vaporising beam is an electron beam.

Reference is now made to the accompanying drawings, in which.

Figure 1:
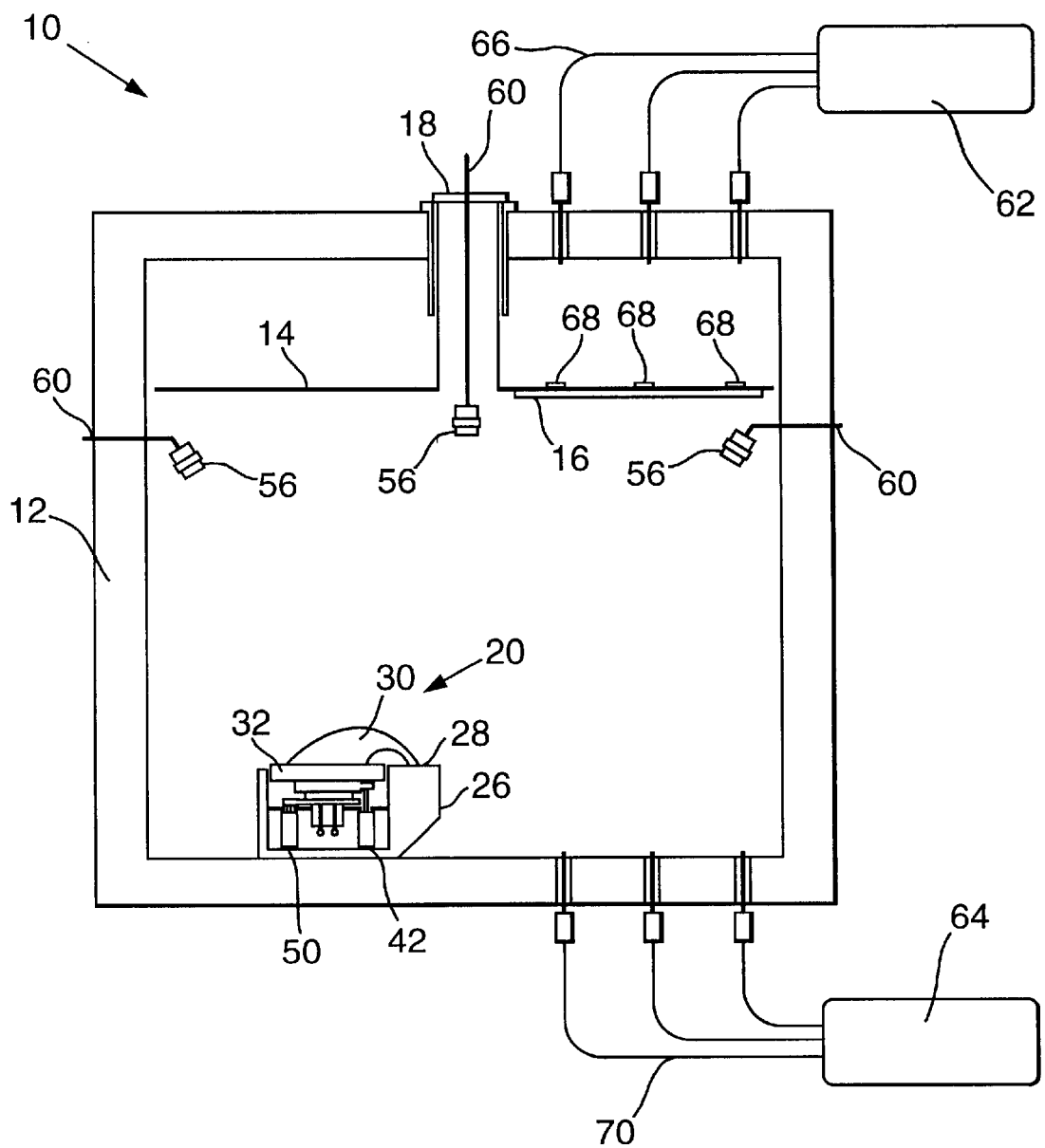
FIG. 1 is a schematic cross-sectional view of an embodiment of an apparatus and method according to the invention.
Figure 2:
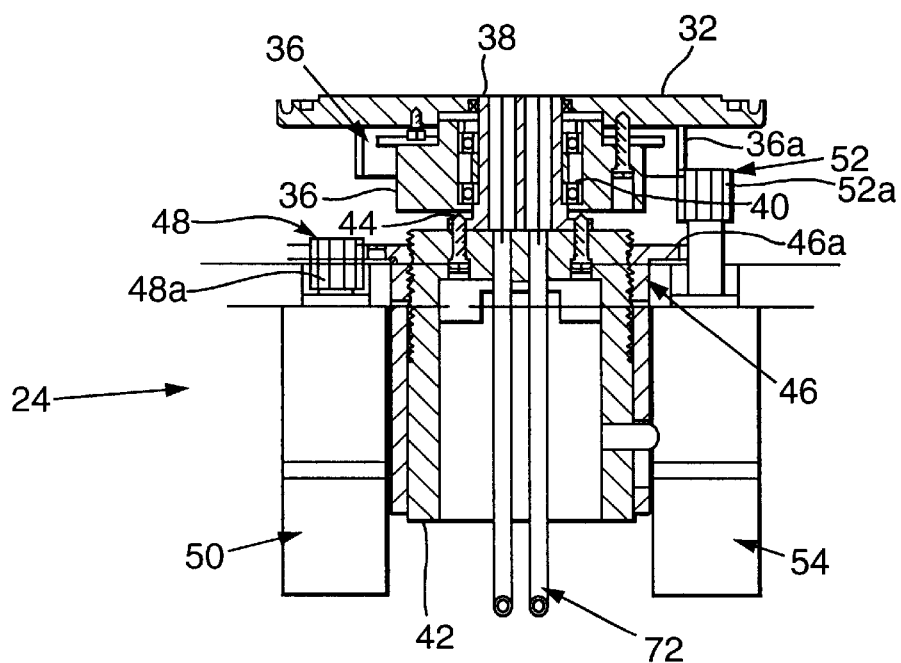
FIG. 2 is a schematic cross-sectional view of a source material holder according to the invention.

Referring to FIGS. 1 and 2, an apparatus according to the invention is generally designated 10. The apparatus 10 comprises a vacuum chamber 12, which includes conventional vacuum generating equipment (not shown) for generating a vacuum within the chamber 12.

Within the vacuum chamber 12 there is disposed a rotatable substrate carrier 14 which carries one or more substrates 16 to be coated (or cleaned). A conventional rotary drive mechanism 18 is provided to rotate the substrate carrier 14.

Also within the vacuum chamber there is disposed a vaporisation means generally designated 20 and a source material holder generally designated 22. The source material holder 22 is shown in greater detail in FIGS. 2, 6 and 7, and further includes a positioning means generally designated 24. The vaporisation means comprises 20 comprises an electron beam gun 26, an electron beam deflection system 28 and an electron beam 30.

The source material holder 22 comprises a receptacle or hearth 32 within which source material 34 is disposed. It will be clear from FIGS. 6 and 7 that the source material 34 presents a surface 34a to the electron beam 30. As the electron beam 30 contacts the surface 34a it vaporises the source material 34. Over a period of time the surface 34a of the source material progressively moves downwards as the source material 34 is used up. The reference numeral 34b designates the surface of the source material after vaporisation has taken place for a period of time. In addition some parts of the surface 34a and 34b may have imperfections such as those indicated at 34c and 34d.

The hearth 32 rests on and is supported by the positioning means 24. The positioning means 24 includes a rotatable carrier 36 which carries the hearth 32. The hearth 32 is fixedly secured to the hearth rotatable carrier 36, whereby any movement in the carrier 36, whether rotational or translational, is imparted to the hearth 32. The rotatable carrier 36 is mounted to a support spindle 38 by means of a bearing arrangement 40 which permits the rotatable carrier 36 to rotate about the spindle 38.

The spindle 38 is fixedly mounted to a non-rotatable carrier 42 by means of screws 44. Thus, the non-rotatable carrier 42 supports the rotatable carrier 36 (and therefore the hearth 32) through the spindle 38.

The positioning means 24 further includes a rotatable member in the form of a rotatable lift gear 46. The lift gear 46 is fixed against translational movement and is provided with an outer toothed periphery 46a which engages corresponding teeth 48a on a lift drive member 48. The lift drive member 48 can be rotated by a vertical drive stepper motor 50. The lift gear 46 is mounted to the non-rotatable carrier 42 via cooperating screwthreads on each of the lift gear 46 and the non-rotatable carrier 42. By means of this arrangement, activation of the stepper motor 50 causes rotation of the drive member 48 which causes rotation of the lift gear 46 which, in turn, causes the non-rotatable carrier 42 to move linearly upwards or downwards. As the non-rotatable carrier 42 moves upwards or downwards, the rotatable carrier 36 and the hearth 32 move upwards or downwards with it.

The rotatable carrier 36 is provided with an outer toothed periphery 36a which engages corresponding teeth 52a on a rotary drive member 52. The rotary drive member 52 can be rotated by a rotation drive stepper motor 54. By means of this arrangement, activation of the stepper motor 54 causes rotation of the rotary drive member 52, which causes rotation of the rotatable carrier 36 which, in turn, causes rotation of the hearth 32.

Thus, it will be clear that the positioning means 24 makes it possible for the hearth to be moved in a rotational and in a translational manner.

Figure 6:
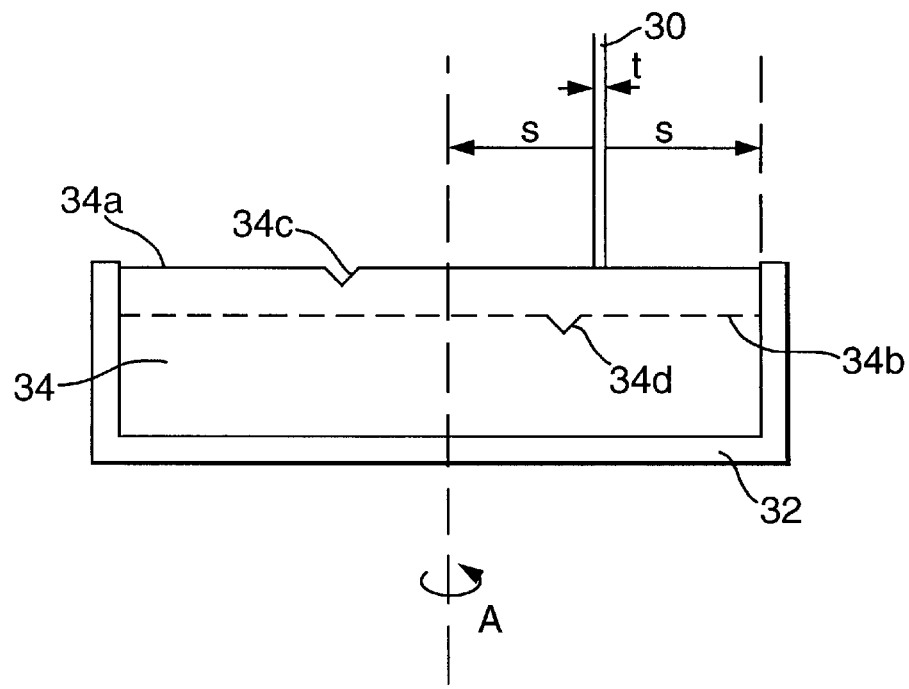
FIG. 6 is a schematic cross-sectional view of an embodiment of part of the source material holder according to the invention.
Figure 7:
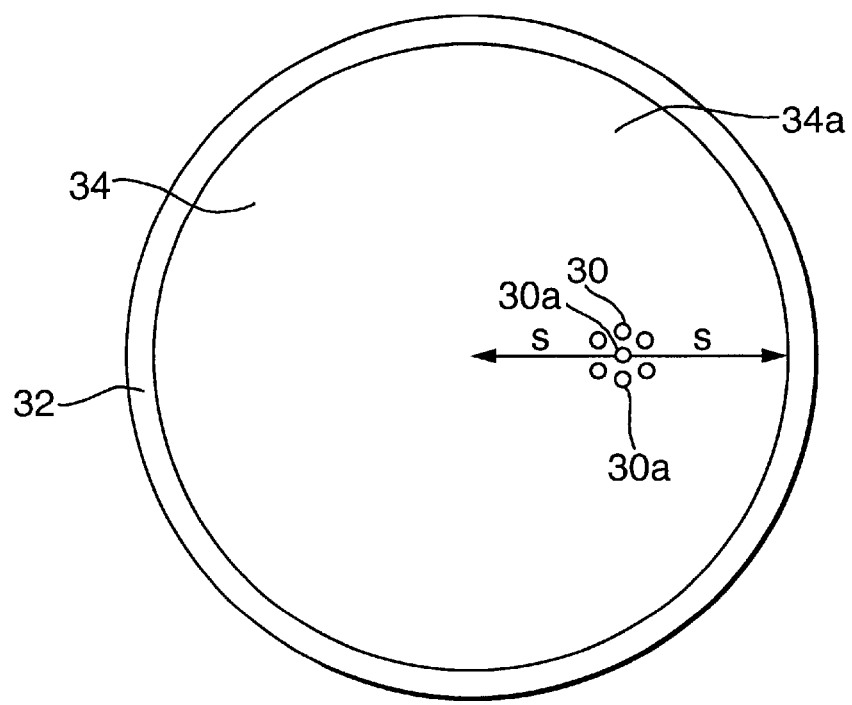
FIG. 7 is a schematic plan view of the source material holder shown in FIG. 6.

With reference to FIGS. 6 and 7, the hearth 32 rotates about an axis designated A which corresponds to the centre of the hearth 32. The electron beam 30 is directed onto the surface 34a in a scanning manner, i.e., the beam 30 is rapidly moved linearly over the surface 34a along the line indicated by the arrows s. This scanning movement, in conjunction with the rotation of the hearth 32, ensures that the whole of the surface 34a is reached by the electron beam. This helps to ensure that the surface is vaporised evenly.

In order to improve the control further, the electron beam gun 26 and the electron beam gun deflector system are designed to allow the frequency of the electron beam 30 to be altered, and also to allow the thickness t of the electron beam 30 to be altered. In addition, it is possible to dither the electron beam 30, so that it randomly contacts part of the surface 34a which are outside of the scanning line s. This is indicated by the reference numeral 30a in FIG. 7.

Returning to FIG. 1, the apparatus 10 further includes a detection means in the form of a plurality of distributed quartz crystals 56 which are disposed around the chamber 12. In FIG. 1, three quartz crystals 56 are shown, but there would usually be at least six crystals, in order to provide a good picture of the variation in the density of the vaporised source material throughout the chamber 12. The quartz crystals 56 are connected to a control system generally designated 58 in FIG. 3 via lines 60.

The detection means of the apparatus 10 further includes an optical detection means in the form of laser light source 62 and a light detector 64. The light source is provided is connected to three fibre optic cables 66, which deliver three light beams to the chamber 12. Three optical monitor witness pieces 68 are provided on the substrate carrier 14 to enable the light to pass through the substrate carrier 14. The base of the chamber 12 is provided with three fibre optic cables 70, each of which is aligned with a respective one of the fibre optic cables 66, to carry the light to the detector 64.

The hearth 32 can reach high temperatures, and for this reason the source material holder is provided with cooling pipes 72 (see FIG. 2) which deliver a cooling fluid, such as water, to cool the hearth 32. The cooling pipes 72 extend within the spindle 38, so that they do not rotate with the hearth 32.

Figure 5:
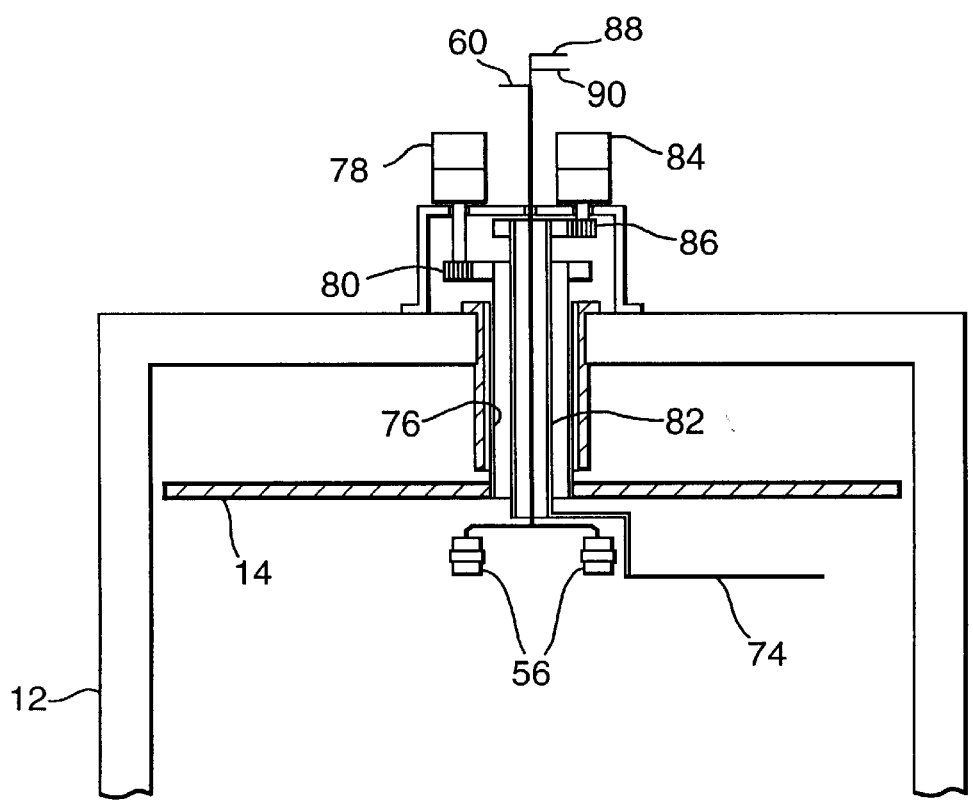
FIG. 5 is a schematic cross-sectional view of an alternative embodiment of the apparatus and method according to the invention.

An alternative embodiment is shown in FIG. 5. Many of the parts shown in FIG. 5 are similar to the parts in FIG. 1, and like parts have been designated with like reference numerals.

It will be seen that the optical detection means is not shown in FIG. 5. This is for the purpose of improving the clarity. The optical detection means may be provided, if desired. It will also be seen that the arrangement of the quartz crystals 56 in FIG. 5 has been changed, in order to take into account the provision of a dynamically rotating mask 74.

In FIG. 5, the substrate carrier 14 is mounted to an outer rotatable member 76 which is rotatable by a drive motor 78 via a gearing arrangement 80. The mask 74 is mounted to an inner rotatable member 82 which is rotatable by a drive motor 84 via a gearing arrangement 86. The inner rotatable member 82 is disposed within the outer rotatable member 76, and is rotatable relative thereto—generally the inner rotatable member 82 is rotated in a direction opposite to the outer rotatable member 76, 50 that the mask 74 is counter-rotating relative to the substrate carrier 14. The data line 60 for the quartz crystals 56 extends within the inner rotatable member 82. A cooling fluid, such as water, is supplied via a cooling water inlet 88 and is withdrawn via a cooling water outlet 90.

The mask 78 is designed to act as a permeable barrier to the passage of the vaporised source material, in order to restrict deposition of the source material on certain parts of the substrate. Thus, the mask 78 provides an additional way of controlling the deposition, and, because it is moving, the control is dynamic.

Figure 3:
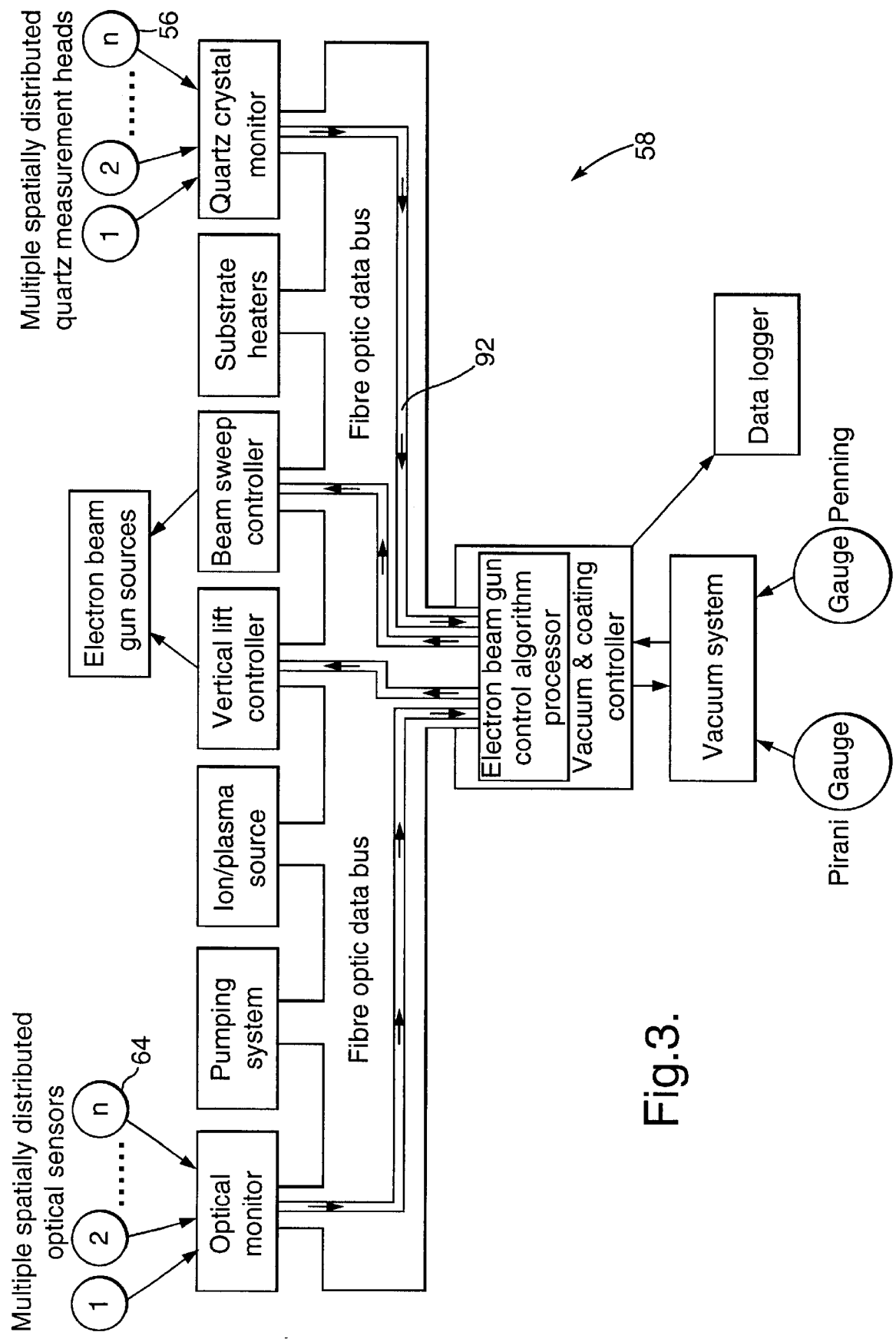
FIG. 3 is a schematic drawing of a control system for use with the apparatus and method according to the invention.

Referring now to FIG. 3, the control system 58 is shown in more detail. FIG. 3 shows the way in which the information from the light detector 64 and the quartz crystals 56 are used to control the positioning means 24 and the electron beam 30. The signals are all relayed along a fibre optic data bus 92. The system also controls and receives data from the a pumping system for the cooling fluids, an ion/plasma source (which is not shown in FIG. 1, but which would often be present), a vacuum system and substrate heaters.

Figure 4:
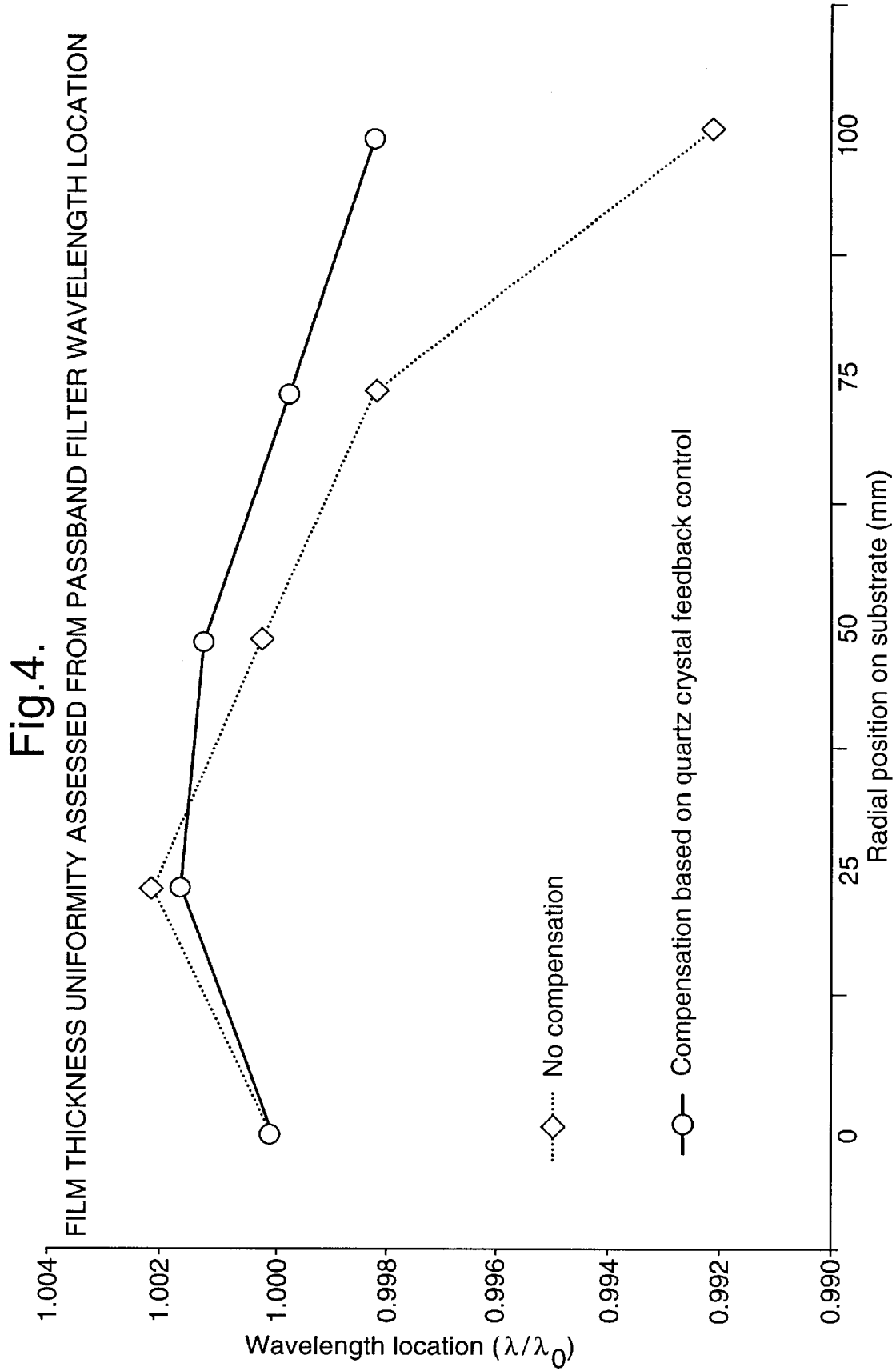
FIG. 4 is graph comparing conventional deposition techniques with deposition carried out by the apparatus and method according to the present invention.

Referring to FIG. 4, the assessment of the effectiveness of the distributed spatial quartz crystal feedback control to electron gun deposition is provided by manufacture of multilayer dielectric optical coatings. A useful optical coating design is the passband filter, where filter wavelength location $\lambda_0$ is a sensitive function of coating thickness. Therefore assessment of wavelength location across a coating area can be utilised to assess film thickness uniformity.

A particular multilayer design used to assess such film uniformity is $(HL)^4 2H(LH)^4 L(HL)^4 2H(LH)^4$ ($H=TiO_2 \lambda/4$ optical thickness, $L=SiO_2$ optical thickness).

Electron beam evaporation of the $TiO_2$ and $SiO_2$ was utilised. Shown in FIG. 4 is the passband wavelength location (normalised with respect to $\lambda^0$) as a function of lateral position on the substrate. Spatial uniformity is shown for passband filters produced with and without use of spatially distributed quartz crystal feedback control of electron gun hearth lift (to preserve substrate to evaporation material surface distance) and electron beam sweep characteristics.

It will be appreciated that the invention described above may be modified.

What is claimed is:

1. Apparatus for treating a substrate, comprising: a vacuum chamber; a substrate carrier adapted to carry a substrate to be treated; a source material holder for holding a source material with which the substrate is to be treated; and vaporizing or sputtering means for vaporizing or sputtering the source material; wherein the source material holder includes a positioning means for relatively moving the source material towards the substrate carrier, said source material holder comprising a receptacle adapted to contain the source material, the positioning means acting on the receptacle to move it in the desired direction, and further wherein the positioning means comprises rotation means for rotating the receptacle and linear movement means for moving the receptacle linearly.

2. Apparatus according to claim 1, wherein a part of the substrate carrier is masked by a dynamic mask disposed between the substrate carrier and the source material holder.

3. Apparatus according to claim 2, further comprising a control means for controlling the positioning means, wherein the position of the dynamic mask is controlled by the control means.

4. Apparatus according to claim 1, wherein the positioning means can move both the receptacle and the vaporizing or sputtering means relative to the substrate carrier, such that there is no relative linear movement between the source material holder and the vaporizing or sputtering means.

5. Apparatus according to claim 1, wherein the positioning means can move the source material linearly relative to the substrate carrier and the vaporizing or sputtering means.

6. Apparatus according to claim 1, wherein the positioning means comprises rotation means for rotating the receptacle and linear movement means for moving the receptacle linearly, the arrangement being such that the linear movement means moves both the rotation means and the receptacle linearly.

7. Apparatus according to claim 1, wherein the rotation means comprises a rotatable carrier, on which the receptacle is mounted, and a drive means for driving rotation of the rotatable carrier.

8. Apparatus according to claim 1, wherein the linear movement means includes a rotary movement to linear movement conversion means comprising a rotatable member, fixed against translational movement relative to the chamber, and a drive means for driving rotation of the rotatable member.

9. Apparatus according to claim 8, wherein the linear movement means comprises a non-rotatable carrier which is linearly movable, and which engages the rotatable member such that rotation of the rotatable member causes said linear movement of the non-rotatable carrier.

10. Apparatus according to claim 9, wherein the rotatable carrier is mounted on the non-rotatable carrier by means of a bearing arrangement, whereby linear movements of the non-rotatable carrier are translated to the rotatable carrier, while the rotatable carrier remains free to rotate relative to the non-rotatable carrier.

11. Apparatus according to claim 9, further comprising a stepped drive means for controlling rotation of the rotatable member, whereby the non-rotatable carrier can be moved linearly in steps of predetermined length.

12. Apparatus according to claim 1, further comprising a control means for controlling the positioning means.

13. Apparatus according to claim 12, wherein the control means also controls the vaporizing means.

14. Apparatus according to claim 13, wherein the control means can vary the frequency and/or the diameter of a vaporizing beam generated by the vaporizing means.

15. Apparatus according to claim 13, wherein the control means can control the movement of a vaporizing beam in order to cause it to dither over the surface of the source material.

16. Apparatus according to claim 1, further comprising a detection means adapted to detect selected conditions within the chamber.

17. Apparatus according to claim 16, wherein detection means includes a vapor detection means adapted to detect the concentration of a vaporized source material within the chamber.

18. Apparatus according to claim 17, wherein the vapor detection means includes at least three detectors capable of detecting the vapor, said detectors being provided in the form of distributed quartz crystals.

19. Apparatus according to claim 16, wherein the detection means includes an optical monitoring detection means adapted to detect the level of deposition of the source material on the substrate.

20. Apparatus according to claim 19, wherein the optical monitoring detection means includes at least one detector capable of detecting the change in light transmission through the substrate during the treatment.

21. Apparatus according to claim 20, wherein the optical monitoring detection means includes a light source and a light detector each arranged on opposite sides of the substrate, the light source being in the form of a laser.

22. Apparatus according to claim 16, further comprising a control means for controlling the positioning means, wherein the conditions detected by the detection means are transmitted to the control means.

23. Apparatus according to claim 1, wherein a part of the substrate carrier is masked by a static mask disposed between the substrate carrier and the source material holder.

24. Apparatus according to claim 1, further comprising a plasma generator to generate a plasma to assist with the deposition of the source material, or an ion beam generator to generate ions to assist with the deposition of the source material.

25. A source material holder for holding a source material intended for vaporization or sputtering and subsequent treatment of a substrate carried on a substrate carrier, said source material holder comprising a receptacle adapted to contain the source material, means to rotate the receptacle, and means to move the receptacle linearly, whereby the source material holder can be rotated and moved linearly simultaneously.

26. A source materiel holder according to claim 25, further comprising means to vaporize or sputter the source material.

27. Apparatus for treating a substrate, comprising: a vacuum chamber; a substrate carrier adapted to carry a substrate to be treated; a source material holder for holding a source material which is to treat the substrate, and further wherein said source material holder comprises a receptacle adapted to contain the source material; vaporizing or sputtering means for vaporizing or sputtering the source material; wherein the vaporizing or sputtering means includes means to generate a vaporizing or sputtering beam for vaporizing or sputtering the source material at a surface thereof, and includes means to vary the frequency of the vaporizing or sputtering beam; and a positioning means acting on the receptacle to move it in a desired direction, wherein the positioning means comprises rotation means for rotating the receptacle and linear movement means for moving the receptacle linearly.

28. Apparatus for treating a substrate, comprising: a vacuum chamber; a substrate carrier adapted to carry a substrate to be treated; a source material holder for holding a source material which is to treat the substrate, and further wherein said source material holder comprises a receptacle adapted to contain the source material; vaporizing or sputtering means for vaporizing or sputtering the source material; wherein the vaporizing or sputtering means includes means to generate a vaporizing or sputtering beam for vaporizing or sputtering the source material at a surface thereof, and includes means to vary the thickness of the vaporizing or sputtering beam; and a positioning means acting on the receptacle to move it in a desired direction, wherein the positioning means comprises rotation means for rotating the receptacle and linear movement means for moving the receptacle linearly.

29. Apparatus for treating a substrate, comprising: a vacuum chamber; a substrate carrier adapted to carry a substrate to be treated; a source material holder for holding a source material which is to treat the substrate, and further wherein said source material holder comprises a receptacle adapted to contain the source material; vaporizing or sputtering means for vaporizing or sputtering the source material; wherein the vaporizing or sputtering means includes means to generate a vaporizing or sputtering beam for vaporizing or sputtering the source material at a surface thereof, and includes means to dither the vaporizing or sputtering beam over the surface of the source material; and a positioning means acting on the receptacle to move it in a desired direction, wherein the positioning means comprises rotation means for rotating the receptacle and linear movement means for moving the receptacle linearly.

* * * * *